United States Patent
Shirakawa et al.

(10) Patent No.: US 8,680,948 B2
(45) Date of Patent: Mar. 25, 2014

(54) BAND ELIMINATION FILTER PROVIDING ATTENUATION WITHIN WIDE RANGE OF FREQUENCIES

(75) Inventors: Kazuhiro Shirakawa, Anjo (JP); Hiroshi Taki, Okazaki (JP); Yoichi Shoji, Anjo (JP)

(73) Assignee: Denso Corporation, Kariya (JP)

(*) Notice: Subject to any disclaimer, the term of this patent is extended or adjusted under 35 U.S.C. 154(b) by 294 days.

(21) Appl. No.: 13/239,961

(22) Filed: Sep. 22, 2011

(65) Prior Publication Data

US 2012/0081193 A1 Apr. 5, 2012

(30) Foreign Application Priority Data

Sep. 30, 2010 (JP) ................. 2010-220838

(51) Int. Cl.
*H03H 7/06* (2006.01)
(52) U.S. Cl.
USPC .......................... 333/176; 333/181
(58) Field of Classification Search
USPC ................... 333/168, 172, 175, 176, 181
See application file for complete search history.

(56) References Cited

U.S. PATENT DOCUMENTS

| | | | |
|---|---|---|---|
| 6,788,168 B2* | 9/2004 | Guitton et al. | 333/170 |
| 2006/0049890 A1* | 3/2006 | Wasaki et al. | 333/12 |

FOREIGN PATENT DOCUMENTS

| | | |
|---|---|---|
| DE | 10 2008 001 570 A1 | 11/2009 |
| JP | 52-080808 | 7/1977 |
| JP | A-2004-072984 | 3/2004 |
| JP | A-2008-086156 | 4/2008 |

* cited by examiner

*Primary Examiner* — Benny Lee
*Assistant Examiner* — Rakesh Patel
(74) *Attorney, Agent, or Firm* — Oliff PLC

(57) ABSTRACT

In a band elimination filter, a plurality of capacitors are connected in parallel between first and second terminals of an electromagnetic noise source which generates voltage fluctuations in a connecting lead connected to the first terminal, with the capacitors being connected to the connecting lead at respectively corresponding branch points. For each capacitor, the total series inductance of a first circuit path is made less than that of a second circuit path, where the first circuit path extends from the corresponding branch point to the second terminal via the capacitor, and the second circuit path extends from that branch point to the first terminal of the electromagnetic noise source. A resistor is connected in series with at least one of the capacitors, for damping parallel resonance caused by inductance components of an adjacent pair of capacitors.

17 Claims, 11 Drawing Sheets

BAND ELIMINATION FILTER PROVIDING ATTENUATION WITHIN WIDE RANGE OF FREQUENCIES

CROSS-REFERENCE TO RELATED APPLICATIONS

This application is based on and incorporates herein by reference Japanese Patent Application No. 2010-220838 filed on 30 Sep. 2010.

BACKGROUND OF THE INVENTION

Field of Application

The present invention relates to a band elimination filter providing attenuation within a specific wide range of frequencies. In particular the invention relates to a band elimination filter enabling a power supply network to be effectively isolated from electromagnetic noise, generated by a source such as an electric motor which is supplied from the network.

One type of application of such a filter is as follows. Motor vehicles are being increasingly provided with a function known as "idling-stop", which automatically halts the vehicle engine when the vehicle becomes temporarily stopped, e.g., at a traffic intersection. As a result, the engine is restarted frequently, and in many cases this restarting will be performed while the vehicle driver is using an entertainment apparatus such as a car radio. Since a high level of electromagnetic noise is generated by the starter motor when activated, the problem arises of interference (e.g., to radio reception) caused by the generated electromagnetic noise.

To suppress this noise, it has been proposed (e.g., in German patent application publication No. 102008001570) to connect a capacitor in parallel with the power supply terminals of the starter motor, to by-pass and thereby attenuate the electromagnetic noise. However such a method has the disadvantage that the noise suppression effectiveness becomes reduced at bands with higher than a certain frequency.

Figure 13:
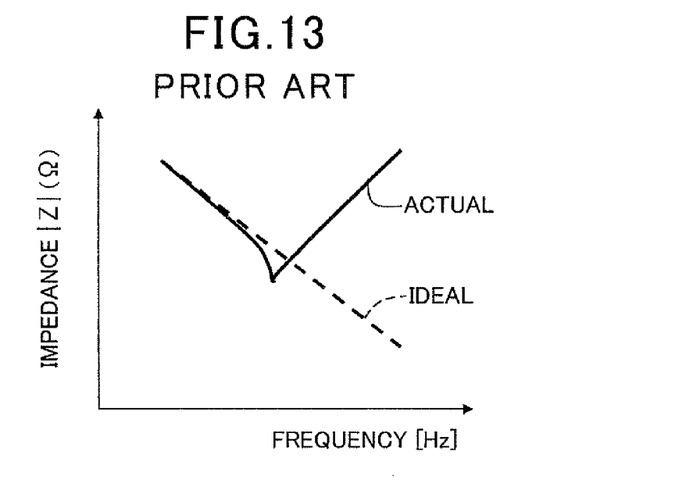

The reason for this is illustrated in the graphs of FIG. 13, showing results of investigations performed by the assignees of the present invention. This shows the ideal relationship (indicated by the broken-line characteristic) between the impedance of a capacitor and the frequency of a signal applied across the capacitor, and an example of the actual relationship (indicated by the full-line characteristic) between the capacitor impedance and frequency. As shown, the impedance should ideally decrease linearly with increasing frequency values. However in practice, the capacitor has a small inductance component (equivalent series inductance). As a result, in a range of frequencies above a specific value, the effects of the inductance component begin to become strong, and the impedance of the capacitor thereafter increases in accordance with increased frequency of the applied signal. The effectiveness of a capacitor when used to attenuate electromagnetic noise, is thereby greatly reduced at frequencies above a certain value.

SUMMARY OF THE INVENTION

It is an objective of the present invention to overcome the above problem, by providing a band elimination filter for use in suppressing electromagnetic noise, whereby the range of frequencies within which noise attenuation is effectively achieved can be made wider than has been possible in the prior art.

The invention provides a band elimination filter comprising a plurality of capacitors connected in parallel with an electromagnetic noise source. A main connecting lead is connected to a first terminal of the electromagnetic noise source. Each of the capacitors has one terminal connected to the main connecting lead at a corresponding branch point, with respective opposite terminals of the capacitors being connected in common to a second terminal of the electromagnetic noise source.

The objectives of the invention are achieved as follows. For each of the capacitors, it is ensured that the total value of series inductance of a corresponding first circuit path is made less than the total value of series inductance of a corresponding second circuit path. The first circuit path extends from the corresponding branch point, via the capacitor, to the second terminal of the electromagnetic noise source. The second circuit path extends from the corresponding branch point to the first terminal of the electromagnetic noise source.

In addition, a resistor is connected in series with at least one capacitor in each of adjacent parallel pairs of capacitors.

The band elimination filter thereby suppresses the generated electromagnetic noise, i.e., blocks the transmission of that noise to the part of the main connecting lead which is located on the opposite side of the filter from the noise source. This is due to two reasons. Firstly, as a result of the above-described inductance relationship between the first and second paths corresponding to each capacitor, the electromagnetic noise becomes attenuated by voltage-division of the noise voltage at each capacitor stage, with the above-described increase of capacitor impedance with increase of frequency (described hereinabove referring to FIG. 13) being eliminated.

Secondly, at least one parallel resonance circuit is formed by a closed circuit containing an adjacent pair of parallel capacitors, due to inductance components of the closed circuit. Such a circuit has a parallel resonance frequency which is determined mainly by the capacitance values of the pair of capacitors and the equivalent series inductance values of these capacitors. With the present invention, a resistor is connected in series with at least one of the capacitors of such an adjacent pair, for damping the parallel resonance.

As a result of these measures, the band elimination filter provides a high degree of attenuation over a predetermined wide range of frequencies, enabling the electromagnetic noise source to be effectively suppressed.

The capacitors may be respective single elements, or each may consist of a plurality of capacitors connected in parallel, or a plurality of capacitors connected in series.

Each resistor may consist of a single element, or may consist of a plurality of resistors connected in parallel or a plurality of resistors connected in series.

Each inductance may be constituted by a section of a connecting lead, e.g., by the series inductance of a section of the main connecting lead which extends between the branch point of a capacitor and the electromagnetic noise source, or the series inductance of a branch connecting lead.

Alternatively, each inductance or part of the inductances may be constituted by a coil (inductance coil).

In each closed circuit containing a parallel pair of capacitors, a resistor (for resonance damping as described above) may be connected in series between one terminal of a capacitor and the branch point corresponding to that capacitor, or between the opposite terminal of the capacitor and the second terminal of the electromagnetic noise source.

Alternatively, a first resistor may be connected in series between one terminal of a capacitor and the corresponding branch connection point, and a second resistor connected in series between the opposite terminal of that capacitor and the second terminal of the electromagnetic noise source.

The electromagnetic noise source may be a rotary machine such as a starter motor or other motor that is connected to a power supply network of a motor vehicle. In that case the band elimination filter can effectively prevent electromagnetic noise source generated by such a motor from entering the power supply network and thereby affecting other equipment of the vehicle, e.g., by causing interference with radio reception.

DESCRIPTION OF PREFERRED EMBODIMENTS

A first embodiment of a band elimination filter, designated by numeral 1 will be described referring to FIGS. 1 to 3. The embodiment is applied to a starter motor 2 of a vehicle, which is connected to a power supply network of the vehicle. The starter motor 2 is a DC motor which is supplied with power from a battery 4 when the contacts of a starter solenoid 5 become closed, to apply torque for starting the vehicle engine. The band elimination filter 1 serves to suppress voltage variations produced by the starter motor 2 within a wide range of frequencies, i.e., electromagnetic noise originating from the starter motor 2.

The starter motor 2 is part of a starter apparatus which includes a clutch that transfers torque from the output shaft of the starter motor to a pinion gear, which engages with a ring gear of the engine when the starter motor is driven for starting the engine.

A connecting lead (referred to in the following as a main connecting lead 8, shown in FIG. 2) is connected to apply a high potential of a battery 4, via the starter solenoid 5 and the band elimination filter 1, to a terminal 2a (high-potential terminal) of the starter motor 2. A low potential of the battery 4 (i.e., a reference ground potential of the power supply network 3) is applied to terminal 2b (low-potential terminal) of the starter motor 2, via a connecting lead or via the metal chassis of a vehicle in which the starter motor 2 is installed. Here, "high potential" signifies a DC potential whose absolute value differs from the ground potential of the power supply network 3. DC power is thereby supplied to the starter motor 2 from the battery 4 during engine starting, when the solenoid contacts are closed. When installed in a vehicle, the power supply network 3 is connected to various other electrical equipment (not shown in the drawings) of the vehicle. The band elimination filter 1 attenuates the level of voltage fluctuations entering the power supply network 3 from the starter motor 2 during engine starting.

As shown, the band elimination filter 1 has three filter terminals ta, tb and tc, and is connected in series between the starter solenoid 5 and the starter motor 2, and connected in parallel with the starter motor 2. Some conductor elements of the band elimination filter 1 (wiring leads or busbars) are electrically connected via terminal tc of the power supply network 3 to the metal housing of the starter motor and thereby connected to the ground potential (low potential) of the power supply network 3. Terminal 2b of the starter motor 2 is also electrically connected directly to the housing of the starter motor 2, while terminal 2a of the starter motor 2 is connected via the band elimination filter 1 and starter solenoid 5 to the high potential of the power supply network 3 during engine starting. Hence DC power is supplied to the starter motor 2 from the battery 4 during engine starting.

Terminal ta of the band elimination filter 1 is connected directly to the high-potential terminal 2a of the starter motor 2 and terminal tb is connected to one contact of the starter solenoid 5, while the other contact of the starter solenoid 5 is connected to the high-potential terminal of the battery 4. Terminal tc is connected directly to the housing of the starter motor 2, i.e., to terminal 2b of the starter motor 2.

Figure 2:
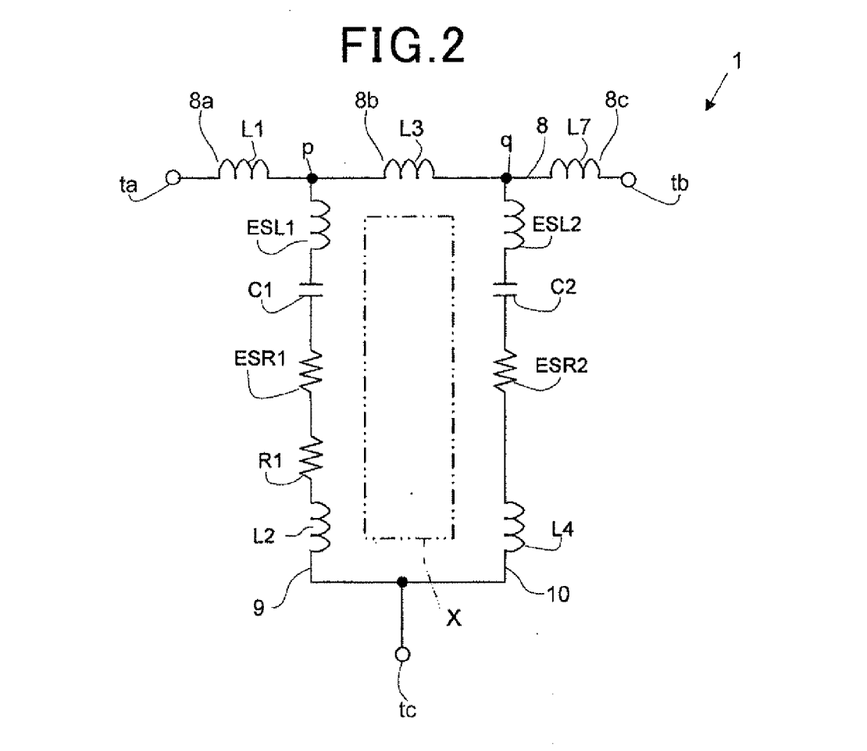
FIG. 2 is an equivalent circuit diagram of a first embodiment of a band elimination filter.

As shown in FIG. 2, the terminals ta and tb are connected by a portion of a main connecting lead 8, which extends between the starter solenoid 5 and the high-potential terminal 2a of the starter motor 2. Sections of a branch connecting lead 9 connect opposing terminals of a capacitor C1 to the terminal tc and to a branch connection point (referred to in the following simply as a branch point) p on the main connecting lead 8, respectively. Similarly, sections of a branch connecting lead 10 connect opposing terminals of capacitor C2 to the terminal tc and to a branch point q on the main connecting lead 8, respectively. The capacitors C1 and C2 are thereby electrically connected in parallel across the starter motor 2.

Inductance and resistance components of capacitors and connecting leads are shown in equivalent circuit form in FIG. 2. L1, L3 and L7 designate respective values of series inductance of sections 8a, 8b and 8c of the main connecting lead 8. These sections respectively extend between the terminal ta and branch point p, between the branch points p and q, and between the branch point q and terminal tb of the band elimination filter 1. L2 and L4 designate respective values of series inductance of the branch connecting leads 9 and 10. ESL1 and ESL2 denote respective equivalent series inductance values of the capacitors C1 and C2, and are designated in common as ESL in the following. ESR1 and ESR2 designate respective equivalent series resistance values of the capacitors C1 and C2, and are designated in common as ESR in the following. Each of the equivalent series inductance and equivalent series resistance values are of small magnitude.

For the purpose of description, a circuit path extending from a branch point (p or q) of the main connecting lead 8 through the corresponding capacitor C1 or C2 (i.e., via the branch connecting lead of that capacitor) to the terminal tc (i.e., to the low-potential terminal 2b of the starter motor 2) will be designated as the "capacitor-side path" corresponding to that capacitor. A circuit path extending from the branch point (p or q) of a capacitor to terminal 2a of the starter motor 2 will be designated as the "motor-side path" corresponding to that capacitor. It will be assumed that the total inductance of the motor-side path of capacitor C1 is L1, and that the total inductance of the motor-side path of capacitor C2 is (L1+L3).

With this embodiment, the total inductance of the capacitor-side branch corresponding to a capacitor is made smaller than the total inductance of the corresponding motor-side path, as described in the following.

As a result, the electromagnetic noise generated by the starter motor 2 becomes voltage-divided by multiple stages, i.e., by a circuit containing capacitor C1 and by a circuit containing the capacitor C2, and is thereby blocked from affecting other parts of the power supply network 3. This noise suppression effect of the first embodiment will be described referring to FIGS. 3A~3C and equations (1) to (3) below. The relationships between the impedance values Z1 to Z4 of equations (1) to (7) below and the inductances L1, ESL1, etc., of FIG. 2 are indicated within FIGS. 3A~3C. Since only the attenuation effects provided by elements of the band elimination filter circuit itself are evaluated, the internal inductance (stator winding inductance) of the starter motor 2 is omitted from consideration.

The attenuation provided by the capacitor C1 (referring to the equivalent circuit of FIG. 3A) is designated as attenuation 1, expressed as:

$$\text{attenuation } 1 = 20 \log_{10}(V_1/V_{noise}) \quad (1)$$

Figure 3A:
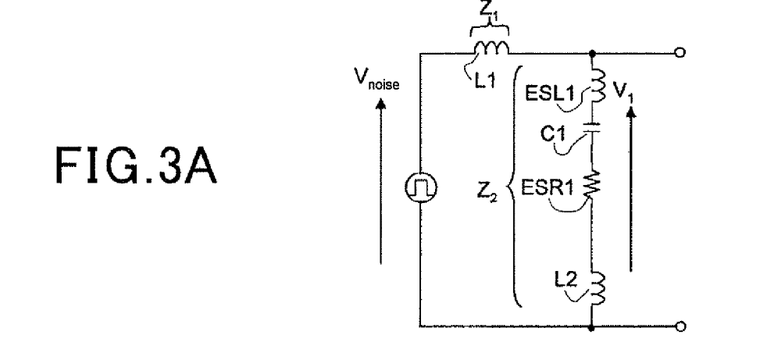
FIGS. 3A, 3B and 3C are equivalent circuit diagrams for use in describing attenuation effects of the first embodiment.
Figure 3B:
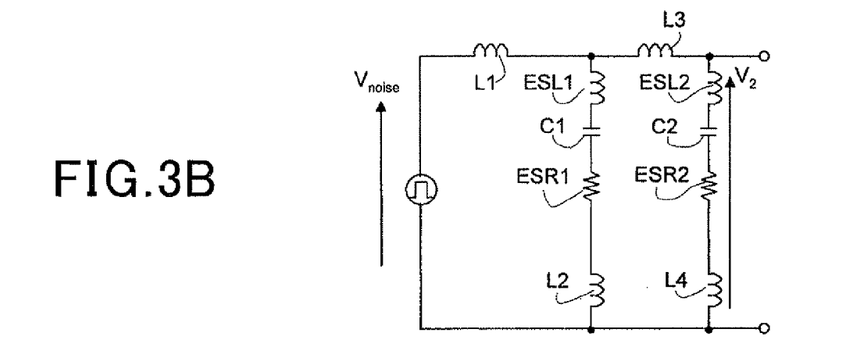
Figure 3C:
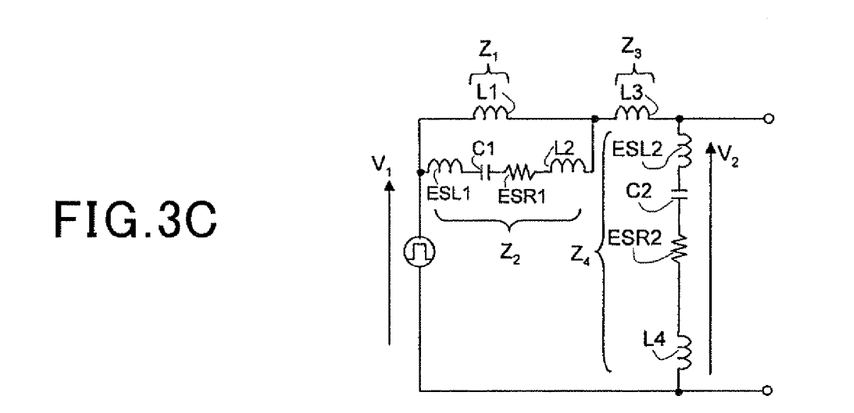

Here, as illustrated by the equivalent circuit of FIG. 3A, $V_{noise}$ is the amplitude of noise voltage which would be applied to the power supply circuit 3 if the band elimination filter 1 were not connected, while $V_1$ is the amplitude of noise voltage applied when the band elimination filter 1 is connected (considering only the attenuation effect of capacitor C1

The ratio $V_1/V_{noise}$ can be calculated from the following equation:

$$V_1/V_{noise} = |Z_2|/(|Z_1|+|Z_2|) \quad (2)$$

Within a range of frequencies in which the capacitive impedance of capacitor C1 is substantially zero, $|Z_1|=2\pi f(L1)$ and $|Z_2|=2\pi f(ESL1+L2)$, where f denotes frequency. By applying equation (2) to equation (1), the attenuation provided by the capacitor C1 can be obtained as follows:

$$\text{attenuation } 1 = 20 \log_{10}\{(ESL1+L2)/(L1+ESL1+L2)\} \quad (3)$$

Next, the attenuation provided by the capacitors C1 and C2 in parallel (see FIG. 3B), designated as attenuation 2, will be calculated. Firstly the attenuation 1, provided by the capacitor C1 as shown in FIG. 3A, is used in the equivalent circuit of FIG. 3B to obtain the equivalent circuit of FIG. 3C containing capacitor C2. The attenuation 2 provided by capacitor C2 is expressed as:

$$\text{attenuation } 2 = 20 \log_{10}(V_2/V_1) \quad (4)$$

$V_2/V_1$ is calculated as:

$$V_2/V_1 = |Z_4|/(|Z_1//Z_2|+|Z_3|+|Z_4|) \quad (5)$$

Within a range of frequencies in which the capacitive impedances of capacitors C1 and C2 are substantially zero: $|Z_1|=2\pi f(L1)$, $|Z_2|=2\pi f(ESL1+L2)$, $|Z_3|=2\pi f(L3)$, $|Z_4|=2\pi f(ESL2+L4)$ Thus, applying equation (5) to equation (4) to obtain equation (6) below, the attenuation 2 provided by capacitor C2 can be calculated as:

$$\text{attenuation } 2 = 20 \log_{10}\{(ESL2+L4)/(L1//(ESL1+L2)+L3+ELS2+L4)\} \quad (6)$$

The combined attenuation provided by the capacitors C1 and C2 is the sum of the attenuations 1 and 2, i.e.,:

$$20 \log_{10}(V_1/V_{noise})+20 \log_{10}(V_2/V_1)=20 \log_{10}\{(ESL1+L2)/(L1+ESL1+L2)\}+20 \log_{10}\{(ELS2+L4)/(L1//(ESL1+L2)+L3+ELS2+L4)\} \quad (7)$$

As shown by equation (7) and as can be understood from the equivalent circuits of FIGS. 3A, 3B and 3C, the amounts of attenuation provided by the capacitors C1 and C2 can be respectively increased as follows. As shown by FIG. 3A, the amount of inductance in series with the capacitor C1 (i.e., sum of ESL1 and L2) should be made small in relation to L1. In that condition, as shown by FIG. 3C, the amount of inductance in series with the capacitor C2 (i.e., sum of ESL2 and L4) should be made small in relation to L3.

Alternatively stated, the total series inductance of a capacitor-side path (from branch point p) corresponding to capacitor C1 is made less than the total series inductance of the corresponding motor-side path (as defined above), and the total series inductance of the capacitor-side path (from branch point q) corresponding to capacitor C2 is made less than the total series inductance of the corresponding motor-side path.

As can be understood from the above, by establishing the above-described inductance value relationships for the capacitor-side path and motor-side path of each of capacitors C1 and C2, the effect of the inductance components of the capacitors C1 and C2 in decreasing attenuation at certain frequencies (i.e., due to increased impedance as described above referring to FIG. 13) can be eliminated. A satisfactory attenuation characteristic over a desired range of frequencies can thereby be obtained.

In addition with the first embodiment, a resistor R1 is connected in series with the capacitor C1. A suitable value of the resistor R1 is determined based on the values of the capacitors C1 and C2 and of associated inductances, as described in the following.

In a band elimination filter having a plurality of capacitors connected in parallel, series-resonance circuits and parallel-resonance circuits arise within the filter circuit, due to inductance components of connecting leads and equivalent series inductances of the capacitors. Usually, the parallel-resonance circuits result in decreased attenuation at certain frequencies, while the series-resonance circuits result in increased attenuation at other frequencies. With this embodiment, for damping such parallel resonance and thereby preventing lowering of attenuation, a resistor R1 is connected in series with the capacitor C1, with resistor R1 having a higher resistance than the equivalent series resistance of capacitor C1.

Figure 1:
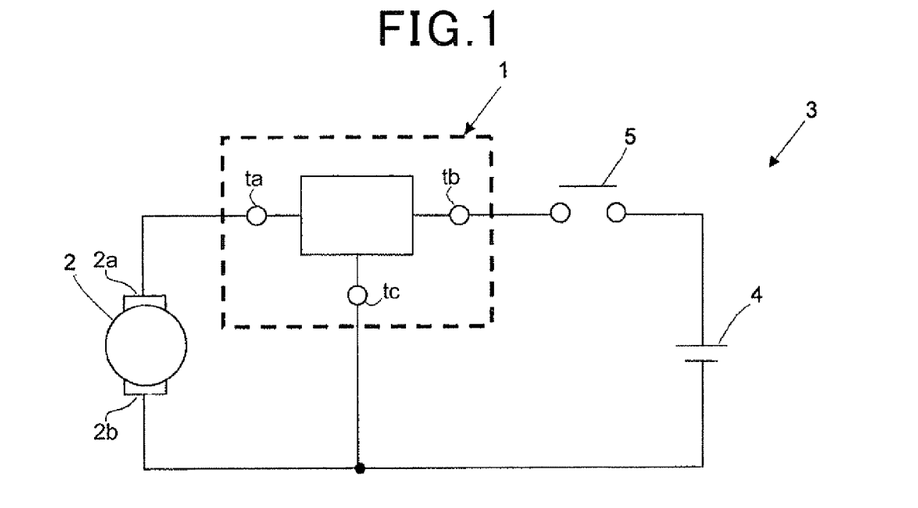
FIG. 1 shows the general configuration of a power supply circuit of a starter motor, incorporating a band elimination filter for suppressing electromagnetic noise generated by the starter motor.

More specifically, a parallel resonance circuit is formed by the closed circuit X indicated in FIG. 1, containing the capacitors C1 and C2. This circuit has a parallel resonance frequency determined by the combined values of the capacitors C1 and C2 and the total inductance value around the closed circuit X. With this embodiment, the parallel resonance is damped by inserting the resistor R1 in series with the capacitor C1, thereby preventing increase of impedance across the capacitors C1, C2 due to the parallel resonance. Hence, lowering of the attenuation of the filter at certain frequencies, due to effects of the ESL of the capacitors C1 and C2, is prevented.

A suitable value of the resistor R1 is calculated as follows, referring to FIG. 2.

First, the total inductance value $L_{all}$ of the closed circuit X formed by the parallel capacitors C1 and C2, and a combined value of the capacitors C1 and C2, are calculated. The total inductance value $L_{all}$ is obtained by adding the sum of the ESL1 and ESL2 values of the capacitors C1 and C2 to the total of the equivalent series inductance values (L2, L3, L4) of the connecting lead portions within the closed circuit X.

Designating the values of capacitors C1 and C2 as c1 and c2 respectively, the combined capacitance $C_{all}$ of capacitors C1 and C2 is obtained as:

$$C_{all}=(c1\times c2)/(c1+c2)$$

The resistance value $R_{all}$ required to suppress parallel resonance within the closed circuit X is then calculated as:

$$R_{all}=2\sqrt{(L_{all}/C_{all})}$$

The required value of the resistor R1 is then obtained by subtracting the total series resistance value of the closed circuit X from $R_{all}$.

It should be noted that the invention is not limited to using this particular value of resistance for resistor R1, however the value should be greater than ESR1. The degree of damping of parallel resonance in the closed circuit containing capacitors C1 and C2 is determined by the value selected for resistor R1.

With this embodiment a single resistor R1 is incorporated in the band elimination filter 1, however it would be equally possible to use a plurality of resistors. For example, two resistors could be respectively connected in series with each of the capacitors C1 and C2. In that case, the required total resistance value of the plurality of resistors is calculated in the same way as for the resistance value of the single resistor R1, described above.

Effects of First Embodiment

With the band elimination filter 1 of the first embodiment as described above, for each of the parallel pair of capacitors C1, C2, with respect to the corresponding one of the branch points p and q, the inductance of the corresponding capacitor-side path is made smaller than that of the corresponding motor-side path (as defined hereinabove). Effects of increased impedance of each capacitor due to equivalent series inductance components of the capacitors are thereby eliminated, enabling effective attenuation to be achieved over a required frequency range. In addition, a resistor R1 is connected in series with at least one capacitor of the pair. The value of the resistor is predetermined such as to damp parallel resonance of a closed circuit containing the capacitors C1, C2.

Improved attenuation is thereby obtained over a predetermined wide range of frequencies, enabling effective suppression of electromagnetic noise source from the starter motor 2 to be achieved.

Second Embodiment

A second embodiment of a band elimination filter will be described referring to FIGS. 4 to 8. Only the points of difference from the first embodiment will be described in detail.

Figure 4:
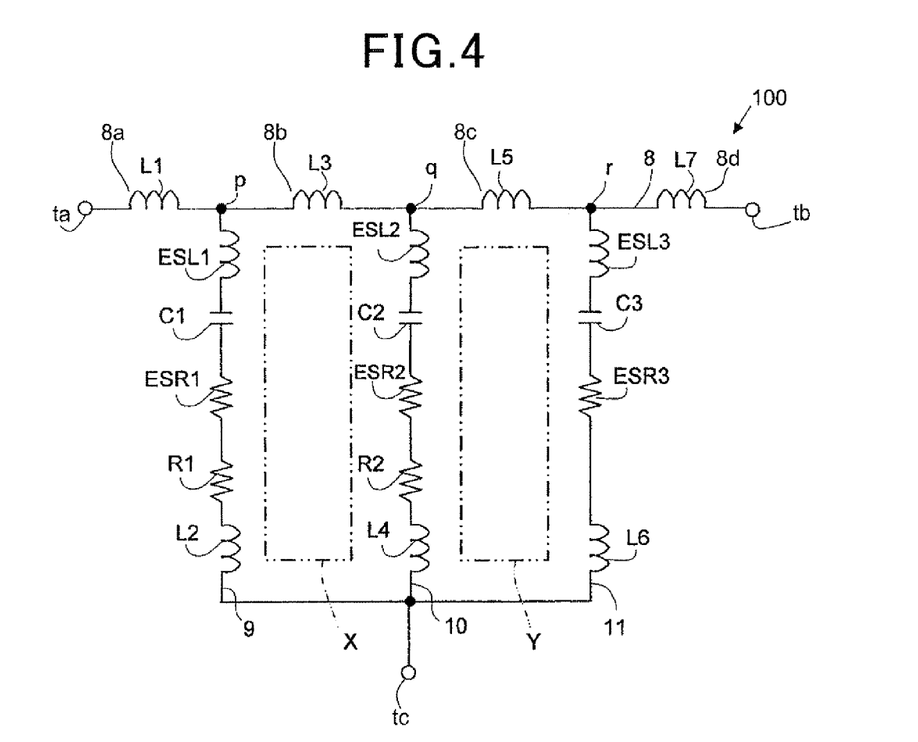
FIG. 4 is an equivalent circuit diagram of a second embodiment of a band elimination filter.

The band elimination filter 100 of the second embodiment differs from the first embodiment in that an additional capacitor C3 is connected between the main connecting lead 8 and the terminal tc, adjacent to the capacitor C3. As shown in FIG. 4, the capacitor C3 has an equivalent series inductance value ESL3 and an equivalent series resistance value ESR3. A branch connecting lead 11 of capacitor C3 is connected to the main connecting lead 8 at a branch point r, L5 denotes the series inductance value of the section 8d of the main connecting lead 8 between the branch point r and terminal ta of the band elimination filter 100, while L6 denotes the series inductance value of the branch connecting lead 11.

A resistor R1 is connected in series between the capacitor C1 and the terminal c, in the branch connecting lead 9, while a resistor R2 is connected in series between the capacitor C2 and the terminal tc, in the branch connecting lead 10. The capacitors C1, C2 and C3 are thus connected in parallel with one another and with the starter motor 2. In other respects, this embodiment is identical to the band elimination filter 1 of the first embodiment.

Suitable values for the resistors R1 and R2 of this embodiment can be calculated similarly to the calculation for resistor R1 of the first embodiment. The resistance values of the resistors R1, R2 are thereby made respectively greater than the equivalent series resistance values of the corresponding capacitors C1 and C2.

The effect of the resistors R1 and R2, in reducing the extent of lowering the attenuation provided by the capacitors C1, C2 and C3 (due to effects of inductance components of capacitors as described above), will be described referring first to FIG. 5. This shows a test apparatus, formed of a power supply network which supplies the starter motor 2, the band elimination filter 100 of the second embodiment, and a LISN (Line Impedance Stabilization Network) 15 which is a power supply impedance stabilization circuit connected to the power supply network 3. The LISN 15 is used here to model the effects of electrical equipment (other than the starter motor 2) which becomes connected to the power supply network 3 when the starter motor 2 is installed in a vehicle and is activated.

Such other electrical equipment of the vehicle, includes auxiliary equipment such as the windshield wiper motor, the blower motor of the vehicle air conditioner apparatus, etc. These auxiliary equipment have respective impedance values, which must be considered when evaluating the electrical characteristics of the starter motor. Hence the evaluation is generally performed using a circuit of the form shown in FIG. 5, in which the LISN 15 is connected to the power supply network 3.

Figure 5:
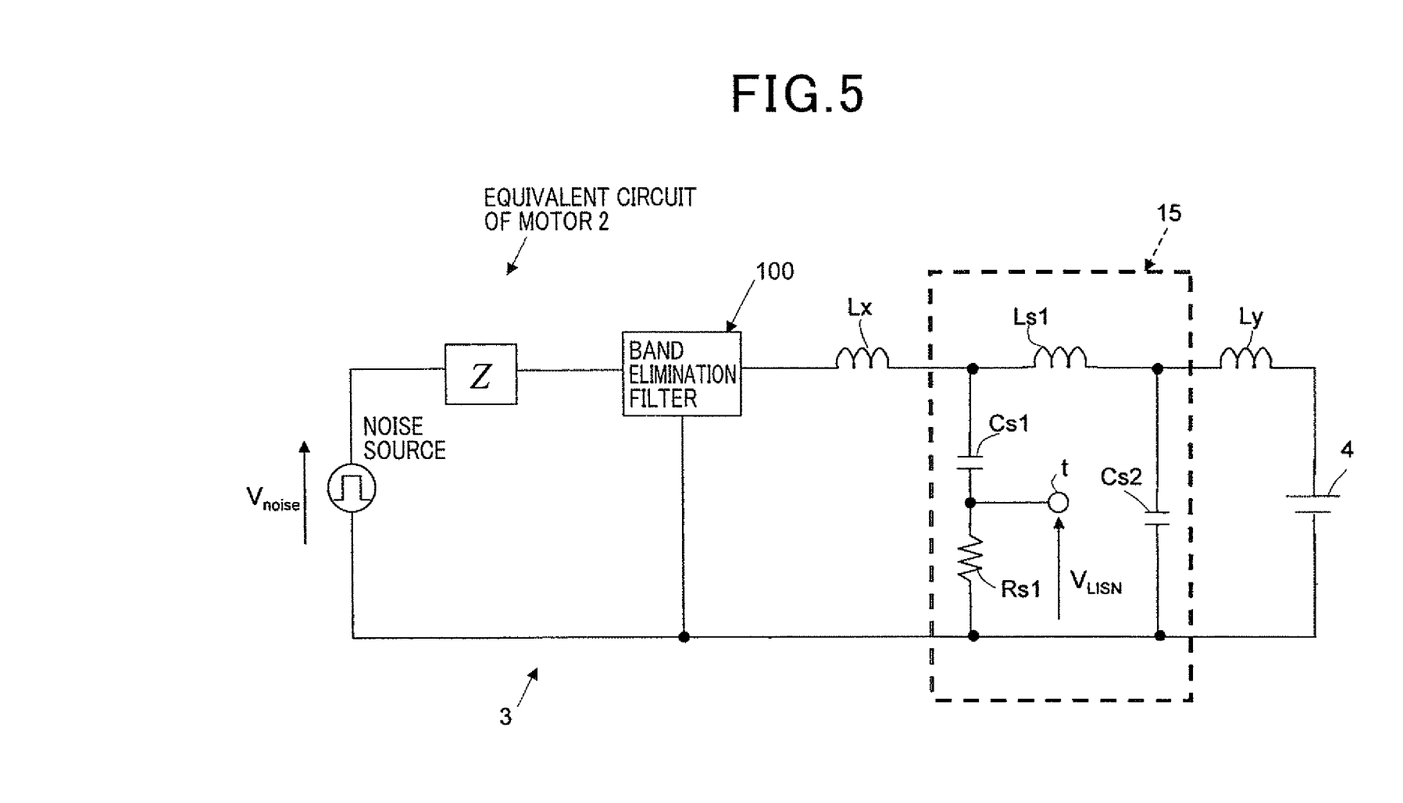
FIG. 5 is a circuit diagram illustrating a band elimination filter test circuit, connected with a band elimination filter in a power supply circuit of a motor.

The LISN 15 consists of capacitors Cs1 and Cs2, a resistor Rs1, and a part of the power supply network 3 that is connected in series with the starter motor 2, having inductance Ls1. The resistor Rs1 is connected to the low-potential terminal of the capacitor Cs1, with the series-connected combination of capacitor Cs1 and resistor Rs1 being connected in parallel with the starter motor 2. The resistor Rs2 is connected in parallel with the starter motor 2. Lx and Ly denote inductance components of connecting lead portions between the band elimination filter 100 and the LISN 15 and between the LISN 15 and the battery 4, respectively. The starter motor 2 is represented in equivalent circuit form as an electromagnetic noise source having a source impedance Z and generating a noise voltage $V_{noise}$.

Figure 6:
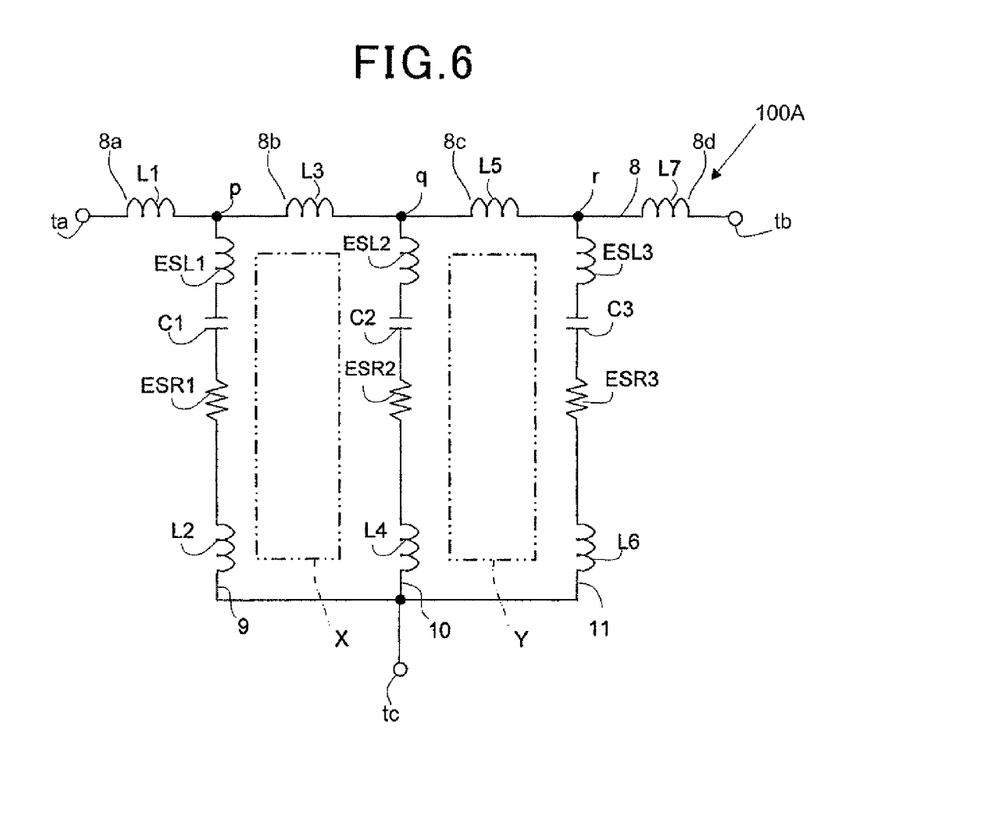
FIG. 6 is an equivalent circuit diagram of a modified form of the second embodiment, for purposes of comparison.

For purposes of comparison, the attenuation effect provided by the band elimination filter 100 will first be described with the resistors R1 and R2 omitted. The resultant band elimination filter 100A is shown in FIG. 6. As shown, this has a closed circuit X containing the capacitors C1 and C2, and a closed circuit Y containing the capacitors C2 and C3. The attenuation provided by the band elimination filter 100A, as measured using the LISN 15 of FIG. 5, can be expressed as 20 $\log_{10}(V_{LISN}/V_{noise})$. Here, $V_{LISN}$ is the value of electric noise voltage, generated by the starter motor 2, which appears at terminal t of the LISN 15 shown in FIG. 5.

Figure 7:
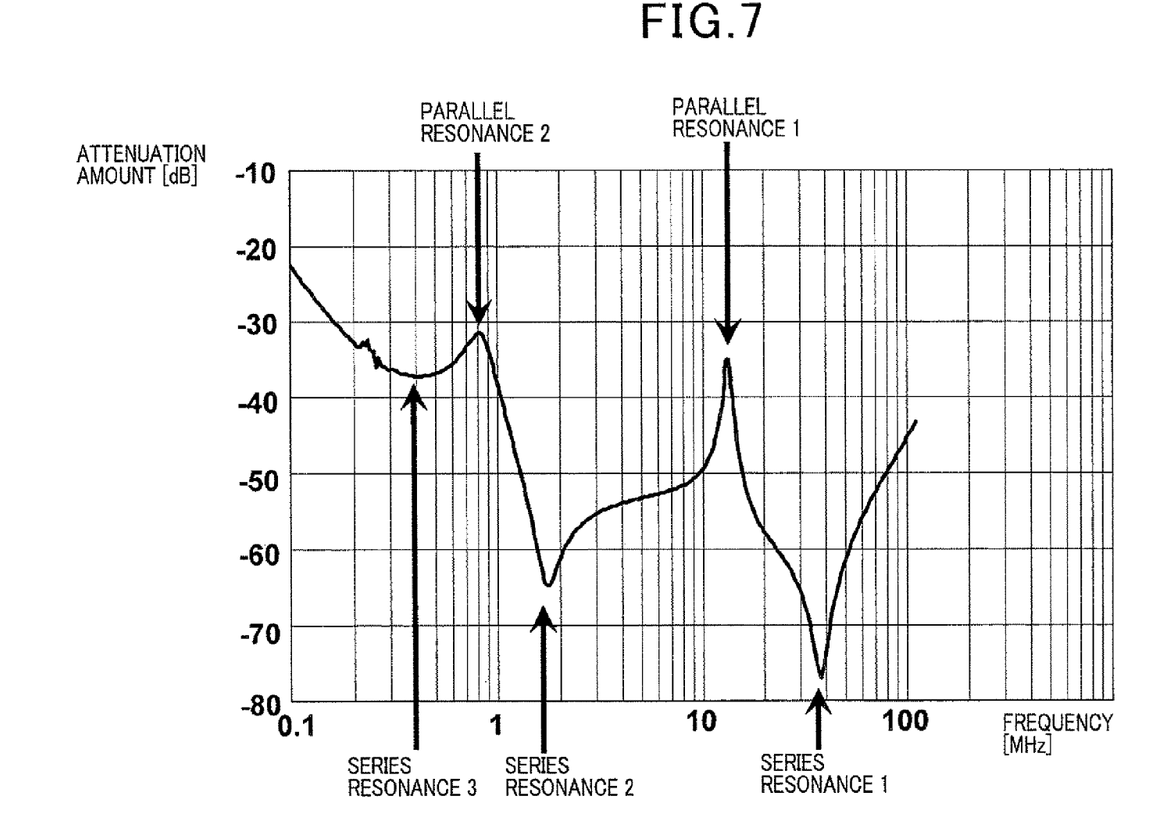
FIG. 7 shows a measured attenuation characteristic provided by the band elimination filter of FIG. 6, for purposes of comparison.

FIG. 7 shows the attenuation characteristic of the band elimination filter 100A when thus measured, displaying frequency regions of increased and decreased attenuation due to resonances which result from the equivalent series inductances of the capacitors C1, C2 and C3. As shown, the characteristic has three series-resonance regions 1, 2 and 3 of increased attenuation, and two parallel-resistor regions 1 and 2 of decreased attenuation. The three series-resonance regions result from series-resonance circuit sections containing capacitors C1, C2 and C3. The parallel-resonance region 1 results from the closed circuit X, containing capacitors C1 and C2, and the parallel-resonance region 2 results from the closed circuit Y, containing capacitors C2 and C3.

As can be understood from FIG. 7, the parallel-resonance circuit sections result in lowering of the attenuation provided by the filter, in frequency regions where the equivalent series inductances of the capacitors C1, C2 and C3 take effect.

Figure 8:
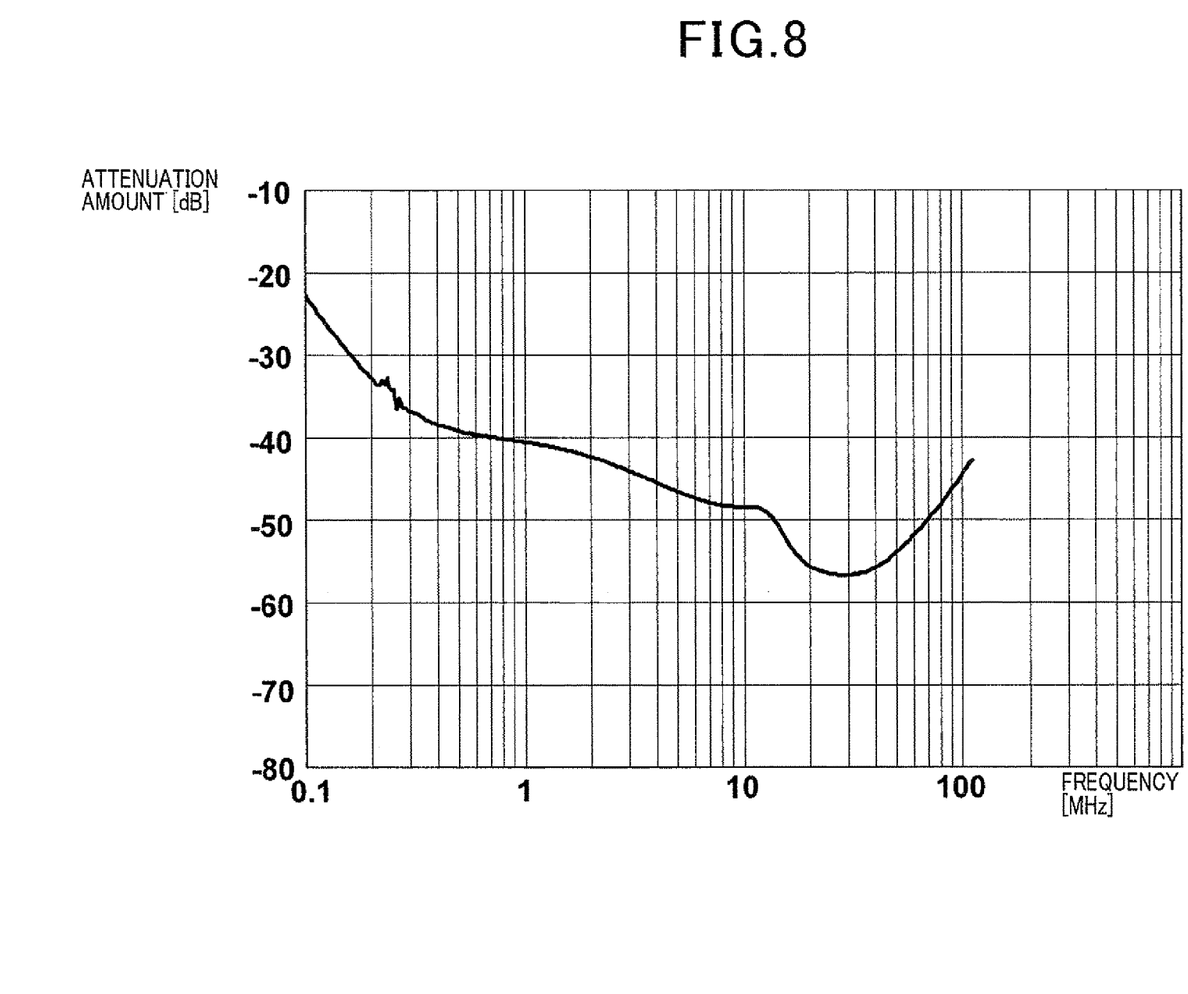
FIG. 8 shows a measured attenuation characteristic provided by the second embodiment.

FIG. 8 shows the attenuation characteristic of the band elimination filter 100, having the resistors R1 and R2 connected in series with the capacitors C1 and C2 respectively, when measured using the LISN 15. As shown by comparison with the characteristic shown in FIG. 7, lowering of the degree of attenuation (due to effects of parallel-resonance circuit sections as described above) at certain frequencies is substantially eliminated. This is due to insertion of the resistors R1 and R2, for damping parallel resonance of the closed circuits X and Y respectively.

Similar effects are provided by resistor R2 of the second embodiment, with respect to damping parallel resonance of the closed circuit Y, to those of the resistor R1 of the first embodiment with respect to resonance of the closed circuit X.

In addition with the band elimination filter 100, the inductance of the capacitor-side path (from branch point p) corresponding to capacitor C1 is made smaller than the inductance of the corresponding motor-side path (as defined hereinabove for the first embodiment), the inductance of the capacitor-side path (from branch point q) corresponding to capacitor C2 is made smaller than the inductance of the corresponding motor-side path, and the inductance of the capacitor-side path (from branch point r) corresponding to capacitor C3 is made smaller than the inductance of the corresponding motor-side path. These inductance relationships ensure elimination of the effect of increased capacitor impedance with increase of frequency above a certain value (due to equivalent series inductance components of capacitors, as described above referring to FIG. 13).

Designating a frequency range in which the capacitive impedance of a capacitor is substantially zero as the "effective frequency range" of the capacitor, the following relationships are established. In the case of the first embodiment, the values of the capacitors C1 and C2 are selected such that the respective effective frequency ranges of the capacitors are successively displaced from one another. Similarly with the second embodiment, the values of the capacitors C1, C2 and C3 are selected such that the respective effective frequency ranges of the capacitors are successively displaced from one another.

Alternative Embodiments

With the band elimination filter 1 of the first embodiment, having two capacitors C1 and C2 connected in parallel with the starter motor 2, a single resistor R1 is connected in series with the capacitor C1. However as described above, it would be equally possible to modify the first embodiment by connecting respective resistors in series with the capacitors C1 and C2, with similar results being obtained.

The invention is not limited to the configurations of the first and second embodiments, having two capacitors or three capacitors connected in parallel with the starter motor 2. It would be equally possible to configure such a band elimination filter with four or more capacitors connected in parallel with the starter motor 2. In that case, as described for the above embodiments, the values of the capacitors should be selected such that the respective effective frequency ranges of the capacitors (as defined above) are successively displaced.

Figure 9:
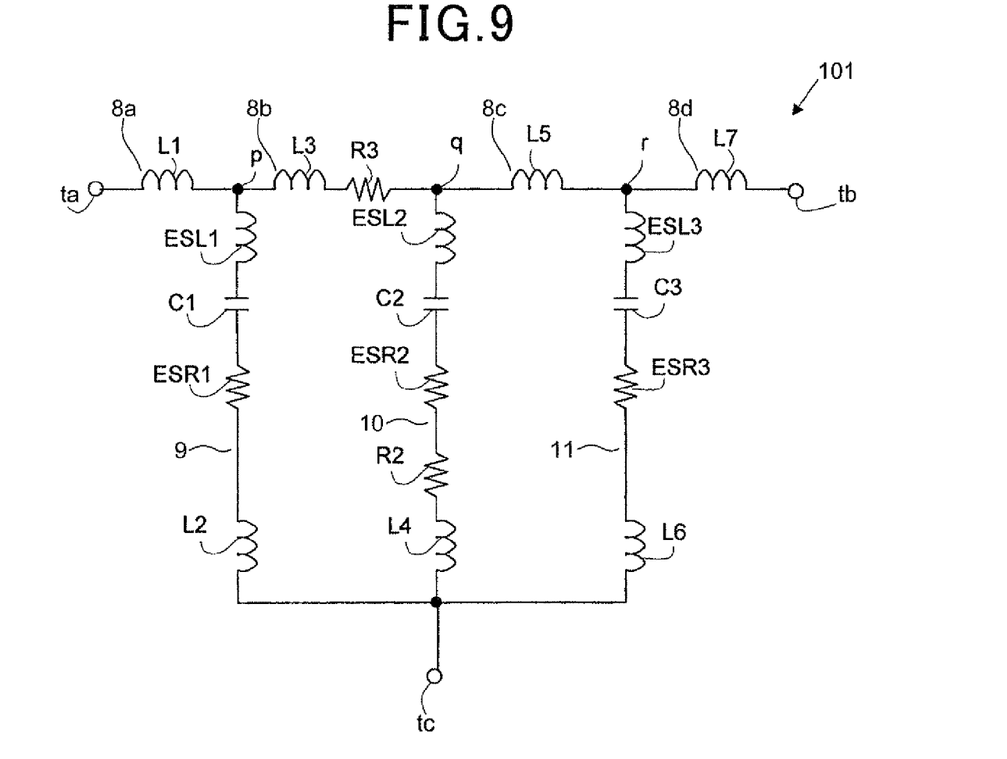
FIG. 9 is an equivalent circuit diagram of a first alternative configuration of the second embodiment.

With the second embodiment, the resistor R1 is connected in series with the capacitor C1, between the low-potential terminal of capacitor C1 and the terminal tc, while the resistor R2 is connected in series with the capacitor C2, between the low-potential terminal of capacitor C2 and the terminal tc. However it is not essential to connect each of these resistors in series with a capacitor. It would be equally possible to connect a resistor R3 between the branch points p and q, for example, as shown in FIG. 9.

Figure 10:
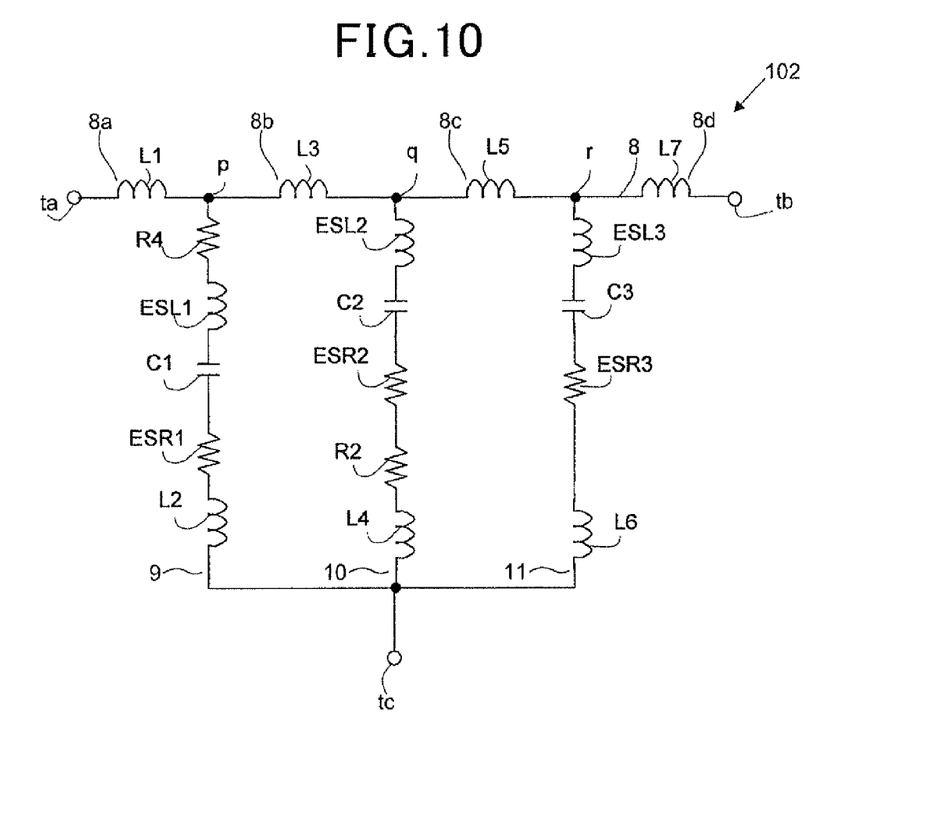
FIG. 10 is an equivalent circuit diagram of a second alternative configuration of the second embodiment.
Figure 11:
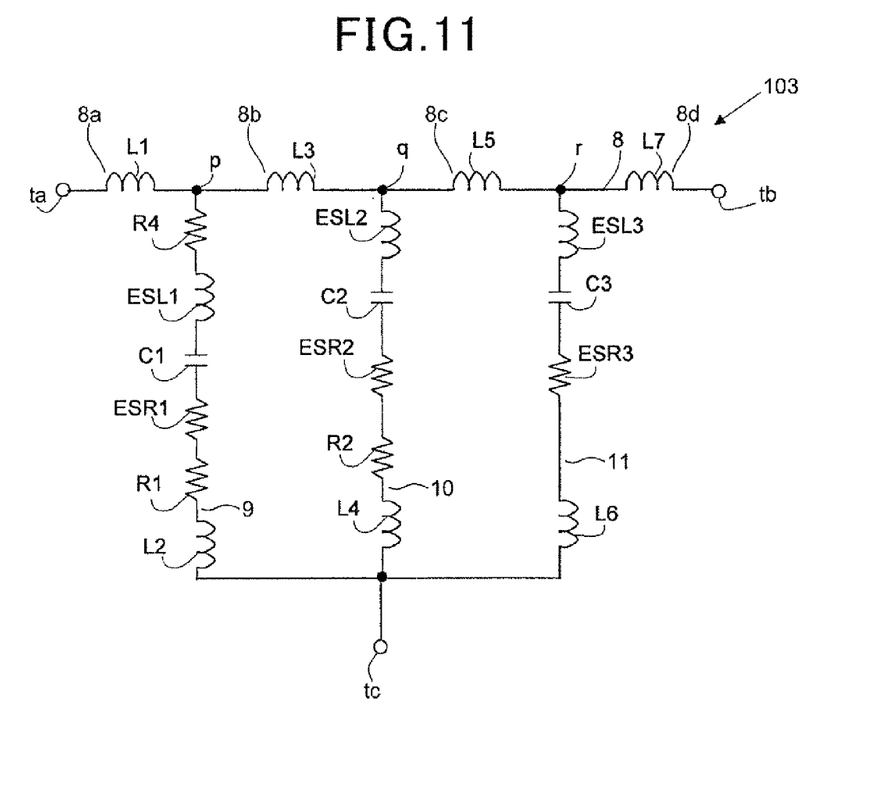
FIG. 11 is an equivalent circuit diagram of a third alternative configuration of the second embodiment.

Furthermore it would be possible to connect such a resistor to the low-voltage terminal or to the high-voltage terminal of the corresponding capacitor. This is illustrated by the band elimination filter 102 shown in FIG. 10, in which the resistor R4 is connected between the high-potential terminal of capacitor C1 and branch point p. Alternatively, as with the band elimination filter 103 shown in FIG. 11, the resistor R4 can be connected between the high-potential terminal of capacitor C1 and the branch point p, with the resistor R1 connected between the low-potential terminal of capacitor C1 and terminal tc.

Figure 12:
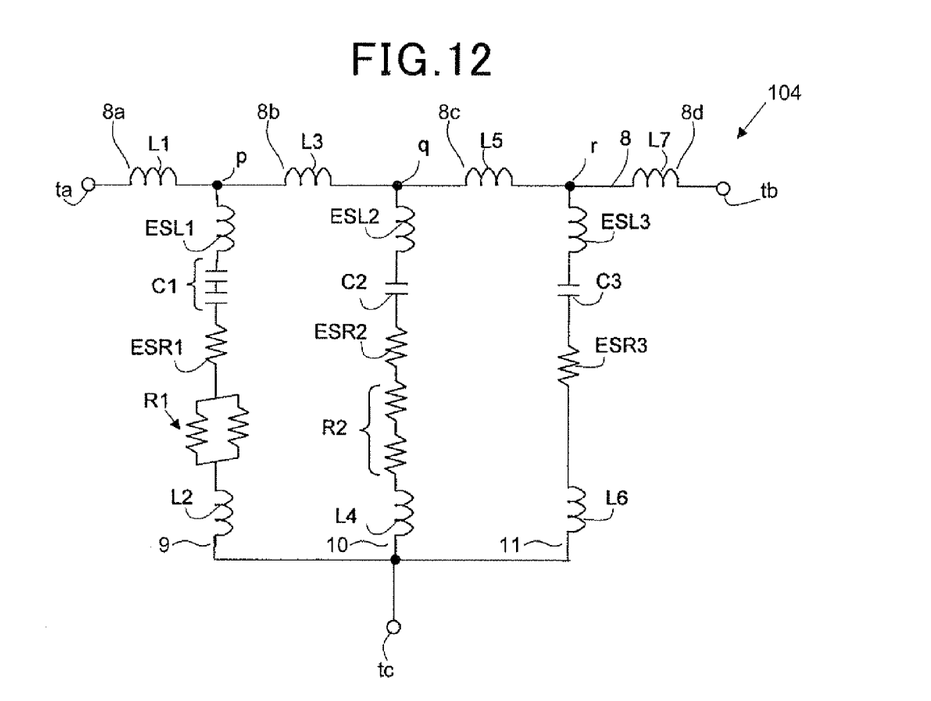
FIG. 12 is an equivalent circuit diagram of a fourth alternative configuration of the second embodiment; and, FIG. 13 is a diagram for describing a disadvantage of the prior art.

Furthermore it would be possible to utilize a plurality of resistors in place of a single resistor, connected in series with a capacitor of the band elimination filter. For example in the band elimination filter 104 shown in FIG. 12, the resistor R1 is formed by a pair of resistors connected in parallel, while the resistor R2 is formed by a pair of resistors connected in series. Similarly it would be possible to utilize a plurality of capacitors in place of a single capacitor of the band elimination filter. For example in the band elimination filter 104, the capacitor C1 is formed by a pair of capacitors connected in series.

Furthermore is not essential for the resistors R1, R2, etc., to be constituted as discrete elements, since it would be possible to achieve the same effect by suitably adjusting the properties (e.g., material, length, shape, etc.) of sections of the branch connecting leads 9, 10, 11 or of the main connecting lead 8, to provide the required resistance values.

Furthermore the above embodiments have been described assuming that the condition exists for each of the capacitors C1, C2, etc.: "total inductance of the corresponding capacitor-side branch is made smaller than the total inductance of the corresponding motor-side path", with that condition being satisfied by having appropriate values of series inductance of respective sections 8a, 8b, etc., of the main connecting lead 8 and of the branch connecting leads 9, 10, etc. However it would be equally possible to ensure that the above condition is satisfied by inserting coils (inductance coils) having appropriate inductance values.

For example referring to FIG. 2 or FIG. 6, a coil could be connected in series between the branch point q and terminal ta, with the coil inductance being L1. Thus a coil could be connected in at least one of the motor-side path and capacitor-side path of one or more of the capacitors C1, C2, C3. The coil inductance value(s) can then be arbitrarily determined such that the above-specified inductance condition is satisfied.

The present invention has been described above with respect to an electromagnetic noise source which is a starter motor of a vehicle, however the invention would be equally applicable to various other types of rotary machine, such as the blower motor of a vehicle air-conditioner apparatus, etc. Furthermore the invention is not limited in application to electric motors, but could equally be applied to other types of apparatus which generate electromagnetic noise and are connected to a power supply network.

It should thus be understood that various modifications and alternative configurations of the above embodiments may be envisaged, which fall within the scope claimed for the invention as set out in the appended claims.

In the appended claims, the term "connecting lead" is to be understood as signifying electric wires in general, or electrical conductor members such as busbars, etc. A "low potential" of a DC power supply signifies a potential corresponding to a reference ground potential of the DC power supply, and a "high potential" signifies a DC potential having an absolute value differing from the low potential.

What is claimed is:

1. A band elimination filter comprising a plurality of capacitors connected in parallel between a first terminal and a second terminal of an electromagnetic noise source, said electromagnetic noise source producing voltage fluctuations on a main connecting lead which is connected to said first terminal of the electromagnetic noise source, said plurality of capacitors being electrically connected to said main connecting lead at respectively corresponding branch connection points;
   wherein:
      with respect to each of said plurality of capacitors, an inductance of a first circuit path is predetermined to be less than an inductance of a second circuit path, said first circuit path extending from the corresponding branch connection point of each of said plurality of capacitors to said second terminal of the electromagnetic noise source via each of said plurality of capacitors, and said second circuit path extending from said corresponding branch connection point to said first terminal of the electromagnetic noise source;
      said band elimination filter comprises at least one resistor connected in series with a corresponding one of said plurality of capacitors; and
      a resistance value of said at least one resistor is predetermined to be greater than a value of an equivalent series resistance value of said corresponding one of said plurality of capacitors.

2. A band elimination filter as claimed in claim 1, wherein said resistance value of said at least one resistor is predetermined for effecting damping of parallel resonance in a closed circuit, said closed circuit containing said corresponding one of said plurality of capacitors and an immediately adjacent one of said plurality of capacitors.

3. A band elimination filter as claimed in claim 2, wherein said resistance value of said at least one resistor is predetermined based upon parameter values of said plurality of capacitors of said closed circuit, said parameter values comprising respective values of capacitance, respective values of equivalent series inductance, and respective values of equivalent series resistance of said plurality of capacitors of the closed circuit.

4. A band elimination filter as claimed in claim 2, wherein a plurality of closed circuits are constituted by respective pairs of parallel-connected adjacent pairs of said plurality of capacitors, and wherein each of said closed circuits comprises at least one resistor connected in series with at least one of the plurality of capacitors of said closed circuit, for effecting damping of parallel resonance in said closed circuit.

5. A band elimination filter as claimed in claim 1, wherein at least one of said plurality of capacitors comprises a plurality of capacitors connected in parallel.

6. A band elimination filter as claimed in claim 1, wherein at least one of said plurality of capacitors comprises a plurality of capacitors connected in series.

7. A band elimination filter as claimed in claim 1, wherein said at least one resistor comprises a plurality of resistors connected in series.

8. A band elimination filter as claimed in claim 1, wherein said at least one resistor comprises a plurality of resistors connected in parallel.

9. A band elimination filter as claimed in claim 1, wherein said at least one resistor is constituted by a resistance component of a connecting lead.

10. A band elimination filter as claimed in claim 1, wherein at least part of at least one of said inductance of said first circuit path and said inductance of said second circuit path is constituted by a series inductance component of a connecting lead.

11. A band elimination filter as claimed in claim 1, comprising at least one inductance coil, wherein at least a part of at least one of said inductance of said first circuit path and said inductance of said second circuit path is constituted by an inductance of said inductance coil.

12. A band elimination filter as claimed in claim 1, wherein a high potential of a DC power source is applied via said first electrical connecting lead to said first terminal of said electromagnetic noise source and via said branch connection points to respective high-potential terminals of said plurality of capacitors,
   a low potential of said DC power source is applied to said second terminal of said electromagnetic noise source and to respective low-potential terminals of said plurality of capacitors.

13. A band elimination filter as claimed in claim 12, wherein said at least one resistor is connected in series between said high-potential side of a capacitor and said branch connection point corresponding to said capacitor.

14. A band elimination filter as claimed in claim 12, wherein said at least one resistor is connected in series between said low-potential side of a capacitor and said second terminal of the electromagnetic noise source.

15. A band elimination filter as claimed in claim 12, wherein said at least one resistor comprises at least one resistor connected in series between said high-potential terminal of a capacitor and said branch connection point corresponding to said capacitor, and at least one resistor connected in series between said low-potential terminal of said capacitor and said second terminal of the electromagnetic noise source.

16. A band elimination filter as claimed in claim 1, wherein said electromagnetic noise source comprises a rotary machine.

17. A band elimination filter as claimed in claim 10, wherein said electromagnetic noise source comprises a starter motor of an internal combustion engine.

* * * * *